United States Patent
Hayes et al.

[11] Patent Number: 6,162,507
[45] Date of Patent: *Dec. 19, 2000

[54] SPIN COATING DISPENSE ARM ASSEMBLY

[75] Inventors: Bruce L. Hayes, Boise; Mark V. Peckham, Meridian, both of Id.

[73] Assignee: Micron Technology, Inc., Boise, Id.

[*] Notice: This patent is subject to a terminal disclaimer.

[21] Appl. No.: 09/206,325

[22] Filed: Dec. 8, 1998

Related U.S. Application Data

[62] Division of application No. 08/667,784, Jun. 21, 1996, Pat. No. 5,849,084.

[51] Int. Cl.$^7$ ..................................................... B05D 3/12
[52] U.S. Cl. ......................... 427/425; 427/240; 427/426; 118/52; 118/320
[58] Field of Search .................................. 427/240, 425, 427/426; 118/202, 52, 54, 320, 319, 302, 313, 315; 134/902; 239/106, 114, 115

[56] References Cited

U.S. PATENT DOCUMENTS

| | | |
|---|---|---|
| 4,886,012 | 12/1989 | Ikeno et al. . |
| 5,002,008 | 3/1991 | Ushijima et al. . |
| 5,020,200 | 6/1991 | Mimasaka et al. . |
| 5,089,305 | 2/1992 | Ushijima et al. ........................ 427/422 |
| 5,289,222 | 2/1994 | Hurtig . |
| 5,312,487 | 5/1994 | Akimoto et al. . |
| 5,358,740 | 10/1994 | Bornside et al. . |
| 5,405,813 | 4/1995 | Rodrigues . |
| 5,427,820 | 6/1995 | Biche et al. ............................. 427/240 |
| 5,429,912 | 7/1995 | Neoh . |
| 5,571,560 | 11/1996 | Lin ......................................... 427/240 |
| 5,658,615 | 8/1997 | Hasebe et al. .......................... 427/240 |
| 5,772,764 | 6/1998 | Akimoto ................................ 118/319 |
| 5,849,084 | 12/1998 | Hayes et al. ........................... 118/320 |
| 5,919,520 | 7/1999 | Tateyama et al. ...................... 427/240 |
| 5,942,035 | 8/1999 | Hasebe et al. ............................. 118/52 |

*Primary Examiner*—Shrive Beck
*Assistant Examiner*—Jennifer Calcagni
*Attorney, Agent, or Firm*—Kirkpatrick & Lockhart LLP

[57] ABSTRACT

An apparatus is disclosed for dispensing liquids on to a rotating surface. The apparatus includes first and second dispense lines connected to at least one liquid source to permit the dispensing of liquids from the first and second dispense lines on to a rotating surface. In a preferred embodiment, the first and second dispense lines are tubular and have first and second dispense tube disposed within the interior region of the first and second dispense lines, respectively. The first and second dispense tubes define first and second annular regions with the dispense lines, which are preferably connected by a fluid channel. A heat exchanger is attached to the first and second annular region to enable a heat transfer medium to be circulated through the first and second annular regions and the fluid channel. Also in a preferred embodiment, a solvent dispense line is disposed between the first and second dispense lines and a vapor solvent bath is provided containing a purge section including a cleaning member to allow excess coating liquid to be rinsed from the first and second dispense lines.

11 Claims, 5 Drawing Sheets

SPIN COATING DISPENSE ARM ASSEMBLY

CROSS-REFERENCE TO RELATED APPLICATIONS

This application is a divisional application of U.S. patent application Ser. No. 08/667,784, filed on Jun. 21, 1996 now U.S. Pat. No. 5,849,084.

STATEMENT REGARDING FEDERALLY-SPONSORED RESEARCH OR DEVELOPMENT

Not Applicable.

FIELD OF THE INVENTION

The present invention generally relates to fluid dispense arm assemblies and methods of using the same. More particularly, the present invention relates to a fluid dispense arm assembly and methods for dispensing photoresist and developer compounds on semiconductor substrate material.

DESCRIPTION OF THE INVENTION BACKGROUND

Integrated circuits are typically constructed by depositing a series of individual layers of predetermined materials on a wafer shaped semiconductor substrate, or "wafer". The individual layers of the integrated circuit are in turn produced by a series of manufacturing steps. For example, in forming an individual circuit layer on a wafer containing a previously formed circuit layer, an oxide, such as silicon dioxide, is deposited over the previously formed circuit layer to provide an insulating layer for the circuit. A pattern for the next circuit layer is then formed on the wafer using a radiation alterable material, known as photoresist. Photoresist materials are generally composed of a mixture of organic resins, sensitizers and solvents. Sensitizers are compounds, such as diazonaphthaquinones, that undergo a chemical change upon exposure to radiant energy, such as visible and ultraviolet light resulting in an irradiated material having differing solvation characteristics with respect to various solvents than the nonirradiated material. Resins are used to provide mechanical strength to the photoresist and the solvents serve to lower the viscosity of the photoresist so that it can be uniformly applied to the surface of the wafers. After a photoresist layer is applied to the wafer surface, the solvents are evaporated and the photoresist layer is hardened, usually by heat treating the wafer. The photoresist layer is then selectively irradiated by placing a radiation opaque mask containing a transparent portion defining the pattern for the next circuit layer over the photoresist layer and then exposing the photoresist layer to radiation. The photoresist layer is then exposed to a solvent, known as developer, in which either the irradiated or the nonirradiated photoresist is soluble, which removes the photoresist in the pattern defined by the mask, selectively exposing portions of the oxide insulating layer. The exposed portions of the insulating layer are then selectively removed using an etchant to expose corresponding sections of the underlying circuit layer. It is important that the remaining photoresist be resistant to the etchant, so as to limit the attack of the etchant to only the exposed portions of the insulating layer. Following the etching process, the next circuit is deposited and the remaining photoresist is stripped from the surface of the wafer typically through the use of a solvent.

Photoresist and developer materials are typically applied to the wafer using a spin coating technique in which the photoresist is sprayed on the surface of the wafer as the wafer is spun on a rotating chuck. The spinning of the wafer distributes the photoresist over the surface of the material and exerts a shearing force that separates the excess photoresist from the wafer thereby providing a thin layer of photoresist on the surface of the wafer. It is necessary to produce a highly uniform photoresist layer to enable the subsequent circuit layers to be precisely placed on the wafer; however, a number of process conditions, such as photoresist temperature, system temperature, photoresist dispensing velocity, rotational speed, system air flow and solvent evaporation rate, greatly affect the characteristics the photoresist layer.

Many of the prior art attempts to provide a dispense system that produces a more uniform photoresist or developer coating have generally focussed on only a limited number of the aforementioned conditions. For instance, U.S. Pat. No. 5,427,820 issued to Biche discloses an photoresist dispense line which incorporates an annular flow path, surrounding an internal photoresist dispense line, in which a heat transfer medium is circulated to control the temperature of the photoresist and related U.S. Pat. No. 5,289,222 issued to Hurtig discloses a method for controlling the solvent evaporation rate in the spin coating apparatus. Also, U.S. Pat. No. 5,405,813 issued to Rodrigues discloses a method to distribute photoresist on the wafer by varying the rotational speed of the wafer during the dispensing and drying process. U.S. Pat. No. 5,020,200 issued to Mimasaka and U.S. Pat. No. 5,429,912 issued to Neoh disclose nozzle designs directed toward decreasing the force with which the photoresist or developer contacts the wafer surface by redirecting the flow of photoresist prior to contacting the surface of the wafer.

The prior art apparatuses and methods have only provided limited insight as to solutions to the problem of a nonuniform air flow field caused by the presence of the dispense line above the spinning wafer. The Biche patent notes that prior art heat transfer disperse devices are sufficiently large so as to block air flow which leads to non-uniform coatings (col. 2, lines 34–38) and suggests that the dispense line of the Biche patent was sufficiently small so that minimal interference to air flow occurs which results in uniform coatings (col. 6, lines 28–31). However, the presence of the dispense line remains an obstruction that causes nonuniformities in the air flow near the wafer.

The present invention is directed to apparatuses and methods for which overcome, among others, the above-discussed problems so as to provide a flow field having increased uniformity over the prior art resulting in more uniform coating being formed on the wafer and an apparatus that is easily maintained during operations.

SUMMARY OF THE INVENTION

The above objects and others are accomplished by a method and apparatus in accordance with the present invention. The apparatus is a dispense arm that includes first and second dispense lines connected to at least one liquid source to permit the dispensing of liquids from the first and second dispense lines on to a rotating surface. In a preferred embodiment, the first and second dispense lines are tubular and have first and second dispense tubes disposed within the interior region of the first and second dispense lines, respectively. The first and second dispense tubes define first and second annular regions in the dispense lines, which are preferably connected by a fluid channel. A heat exchanger is attached to the first and second annular region to enable a heat transfer medium to be circulated through the first and second annular regions and the fluid channel to control the temperature of the liquid to be dispensed.

Also in a preferred embodiment, a solvent dispense line is disposed between the first and second dispense lines and a vapor solvent bath is provided containing a purge section including a cleaning member to allow excess coating material to be rinsed from the first and second dispense lines.

Accordingly, the present invention provides an improved apparatus and method to control the air flow surrounding a rotating surface and to dispense liquids on the rotating surface in more than one position to provide the capability to fully coat larger surface in a cost effective and timely manner. These and other details, objects, and advantages of the invention will become apparent as the following detailed description of the present preferred embodiment thereof proceeds.

BRIEF DESCRIPTION OF THE DRAWINGS

Preferred embodiments of the present invention will be described in greater detail with reference to the accompanying drawings, wherein like members bear like reference numerals and wherein.

DETAILED DESCRIPTION OF PREFERRED EMBODIMENTS

Figure 1:
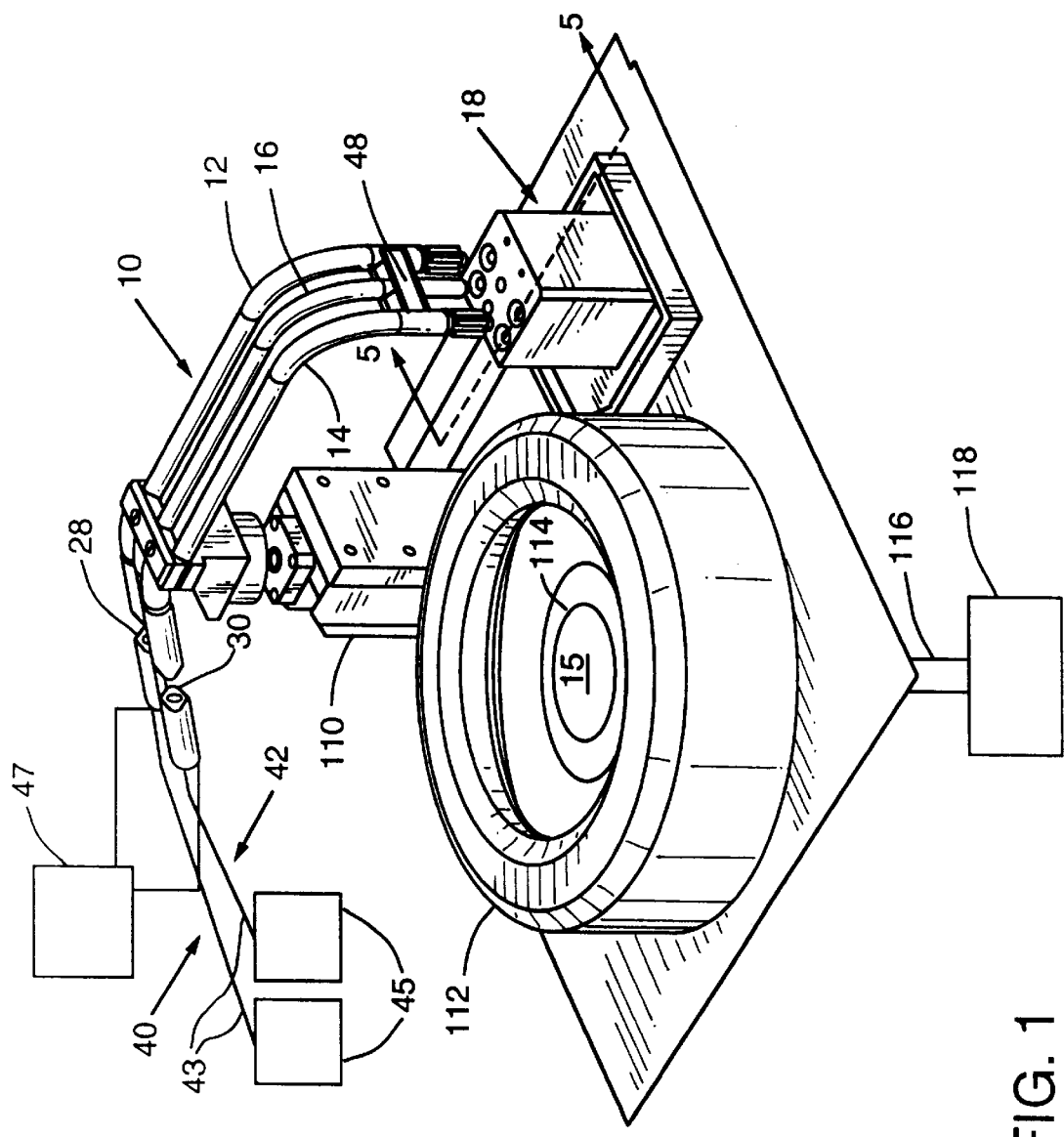
FIG. 1 is a perspective view of a preferred embodiment of the present invention raised out of a stored position in part of a spin coating system.
Figure 2:
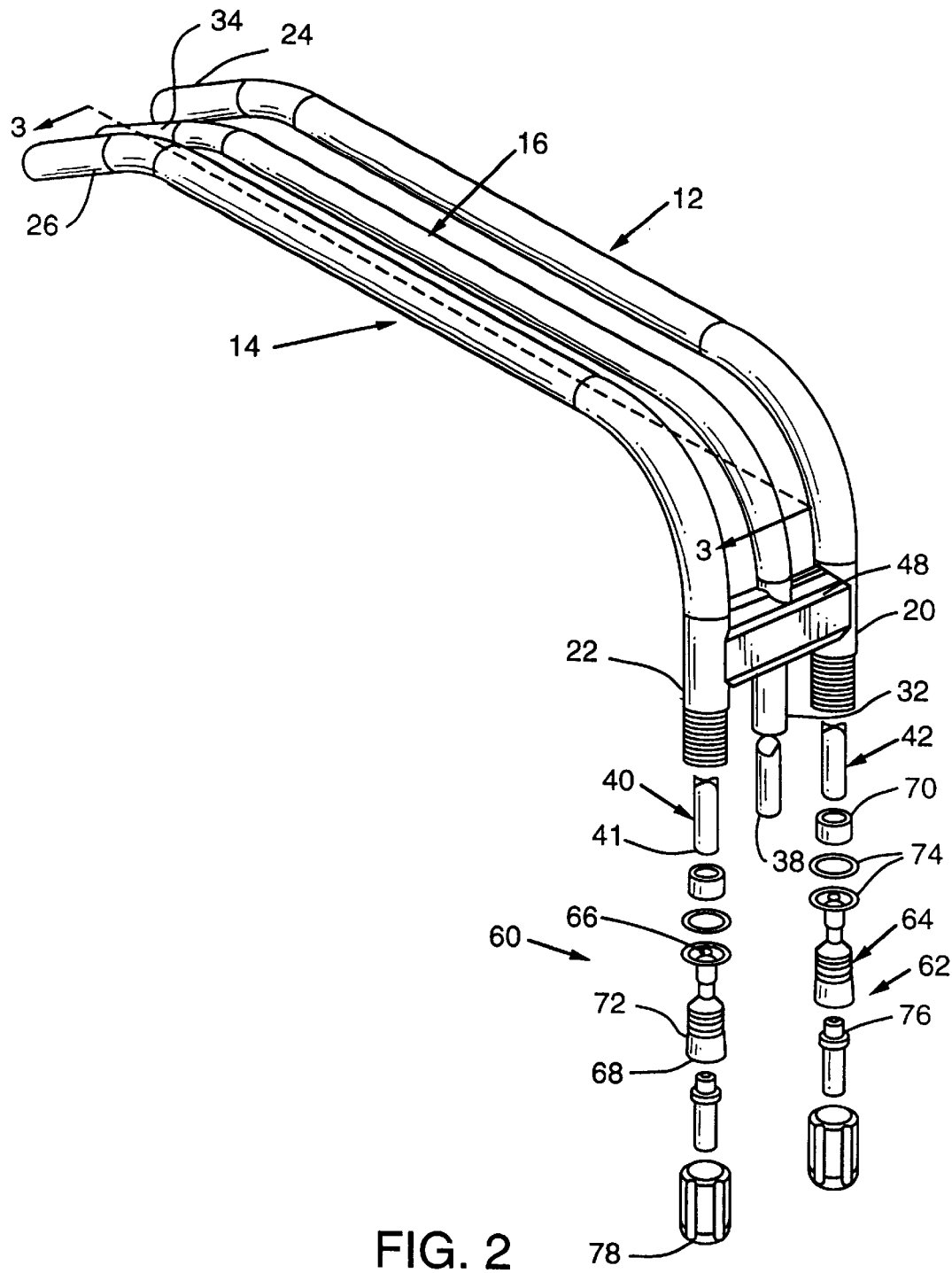
FIG. 2 is a perspective view of a preferred embodiment with an exploded view of a preferred nozzle assembly.
Figure 3:
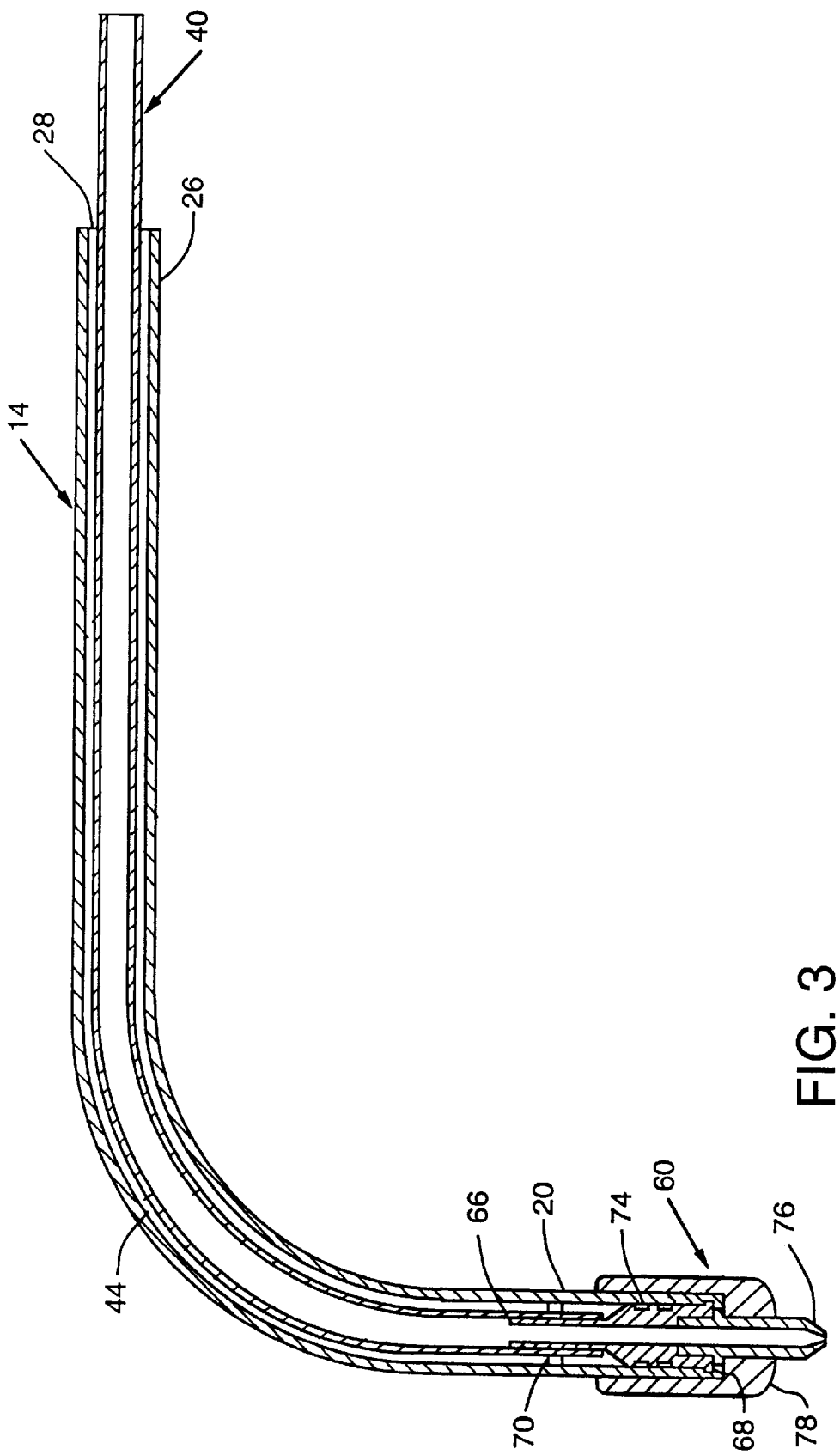
FIG. 3 is a cross sectional view of a dispense line along line 3—3 in FIG. 2.
Figure 4:
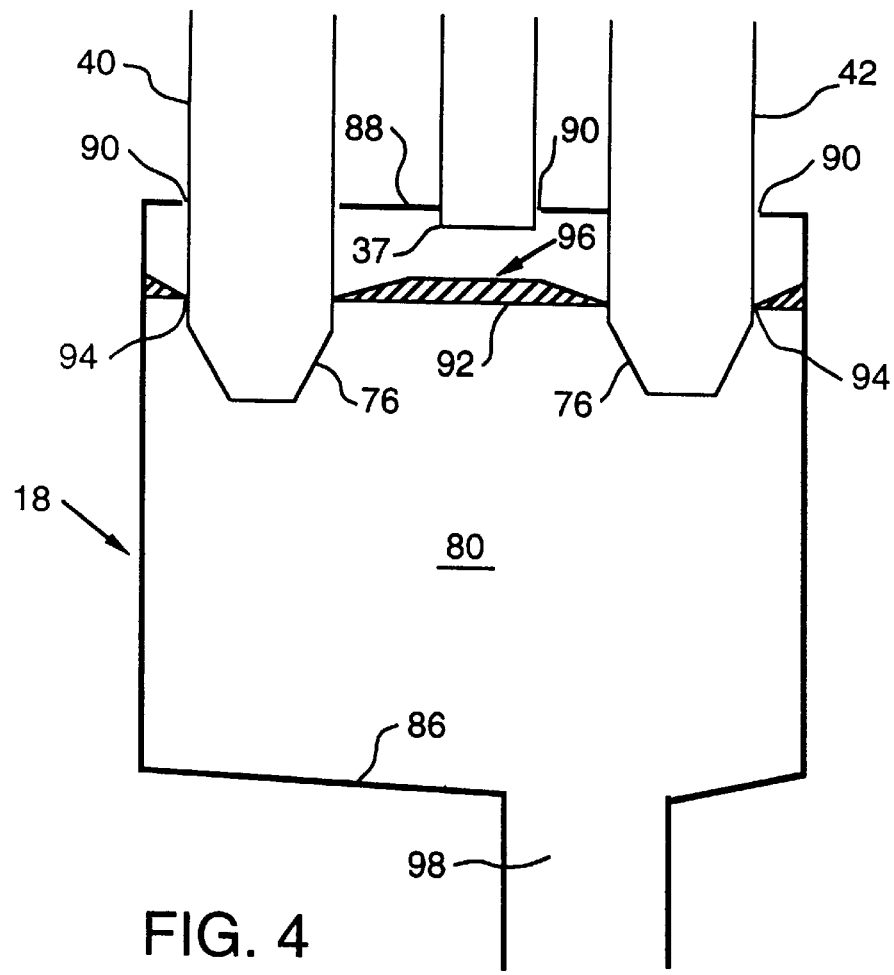
FIG. 4 is a schematic depiction of the purge section of the solvent bath along line 4—4 in FIG. 1.
Figure 5:
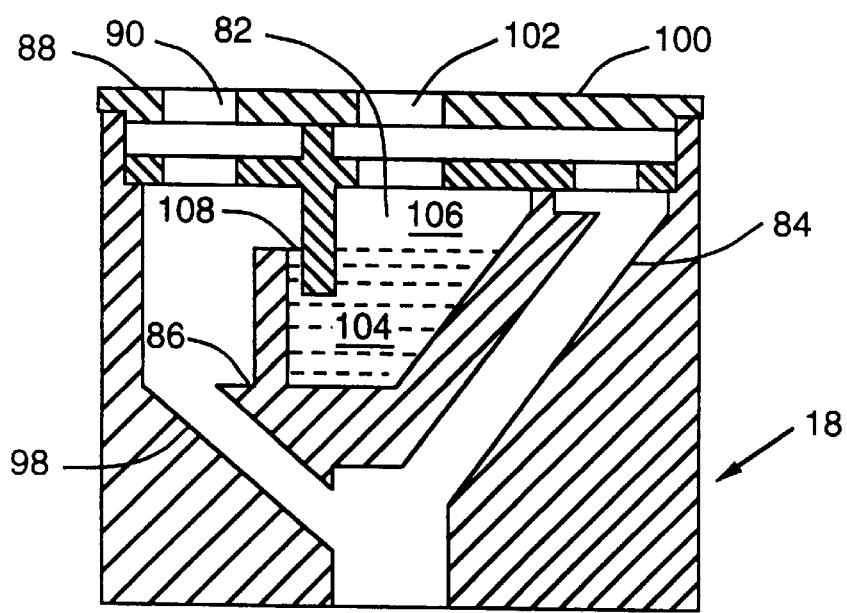
FIG. 5 is a side cross sectional view of the solvent bath; and along line 5—5 in FIG. 1.
Figure 6:
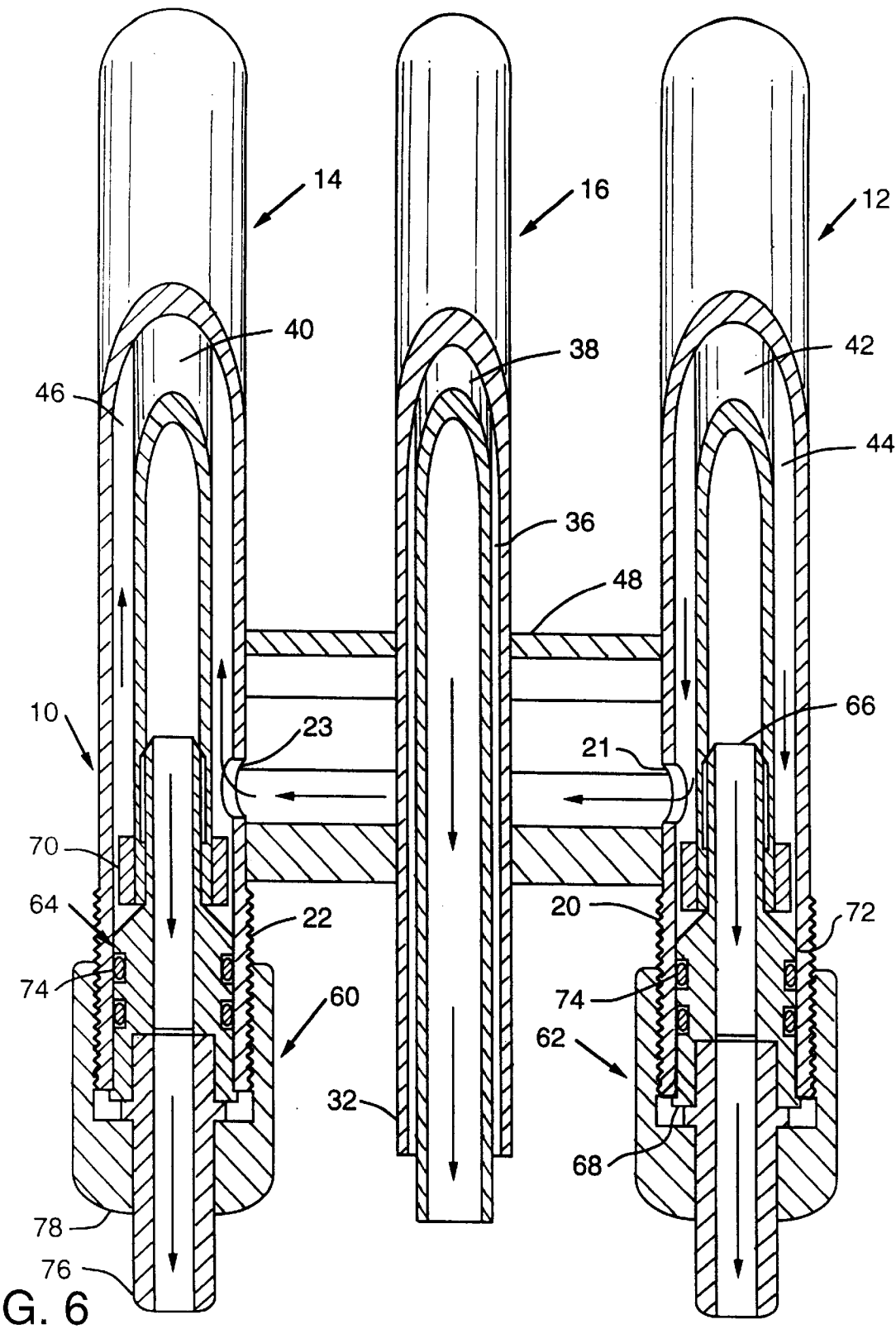
FIG. 6 is a front cross sectional cutaway view showing the flow paths through the dispense lines and solvent line.

The operation of the apparatus 10 will be described generally with reference to the drawings or the purpose of illustrating present preferred embodiments of the invention only and not for purposes of limiting the same. The apparatus 10 of the present invention is a dispense arm that includes first and second dispense lines 12 and 14 through which liquids flow and are dispensed onto a rotating wafer surface 15. A solvent dispense line 16 is provided between the first and second dispense lines, 12 and 14, to clean excess coating material off the dispense lines 12 and 14 and to fill a solvent bath 18. While preferred embodiments of the invention will be discussed with respect to dispensing photoresist, developer and rinse solution for use in manufacturing silicon wafers for semiconductors, one skilled in the art will appreciate that the invention can be suitably modified to apply other types of process liquids to a surface.

In a preferred embodiment, the first and second dispense lines, 12 and 14, respectively, are identical cylindrical tubular lines having dispense ends 20 and 22, source ends 24 and 26, interior regions 28 and 30, respectively, and a uniform cross sectional dimension perpendicular to the direction of flow. The first and second dispense lines, 12 and 14, are aligned in parallel and the dispense ends 20 and 22, respectively, are directed substantially perpendicular toward the rotating surface 15. The first and second dispense lines, 12 and 14, contain opposing ports, 21 and 23, respectively, adjacent to the dispense ends 20 and 22, respectively. The dispense lines are preferably constructed of stainless steel, although any material of suitable strength and rigidity can be used with the scope of the invention. Alternatively, the first and second dispense lines, 12 and 14, respectively, do not have to be identical or aligned in parallel, but can be varied to achieve the result desired by the skilled practitioner. In addition, it may be desirable to include additional dispense lines to ensure complete coverage of a large surface area where it would be inefficient and impractical to coat the surface using only one dispense line.

The solvent line 16 is also preferably aligned parallel to and disposed between the first and second dispense lines, 12 and 14. The solvent line 16 is cylindrically shaped having a dispense end 32 directed substantially perpendicular to the rotating surface 15, an inlet end 34 and an interior region 36. An internal solvent dispense tube 38 is disposed within the interior region 36 of the solvent line 16 and is connected to a solvent source to provide for the dispensing of solvent out of the dispense end 32. In developer applications, the solvent line 16 is used to dispense water onto the surface of the wafer to rinse the developer solution off the wafer. In photoresist stripping applications, solvents are dispensed onto the surface of the wafer using the solvent line 16 to strip any remaining photoresist off the wafer following processing. In this manner, the arrangement of the dispense lines, 12 and 14, and the solvent line 16 can be used for all of the processing and storage without having to commingle solvents and coatings in the same lines.

In a preferred embodiment for a spin coating application, the dispense lines, 12 and 14, respectively, are ½ inch diameter tubes with a two inch spacing centerline to centerline and the solvent line 16 is a ⅜ inch diameter tube positioned between the dispense lines, 12 and 14, respectively, to provide a gap of ⅝ inch. We have found that reducing the gap spacing to ½ inch, (i.e. one tube diameter) adversely affects the air flow performance of the apparatus 10, thus it is preferred to maintain a gap spacing greater the diameter of the dispense lines, 12 and 14. In addition, better air flow performance is derived if the solvent line 16 has a smaller diameter than the dispense lines, 12 and 14. An important consideration in the determination of the number and cross sectional dimensions of the dispense lines to be used in the present invention is to minimize the cross sectional dimension and the total cross sectional area of all of the dispense lines.

Preferably, first and second dispense tubes, 40 and 42, respectively, are disposed within the interior regions the first and second dispense lines, 12 and 14, respectively, to define first and second annular regions, 44 and 46, respectively. The dispense tubes, 40 and 42, are preferably identical, have dispense and source ends, 41 and 43, respectively, and are constructed of plastic tubing or other flexible material that can be fed through the rigid dispense lines, 12 and 14 and can be easily changed. Alternatively, the dispense tubes can be constructed from rigid material and also may be fixed within the dispense lines, such as through the use of spacers. The source ends 43 of the dispense tubes, 40 and 42, respectively, are connected to one or more liquid sources. Generally, the source ends 43 will be connected to the same liquid source 45; however, there is no requirement that the same source be used or that the number of sources 45 be limited to one as shown in FIG. 1. A fluid channel 48 is perpendicularly connected between the opposing ports 21 and 23 in the first and second dispense lines, 12 and 14, adjacent to the dispense end 20 to provide fluid communication between the first and second annular regions, 44 and 46. A conventional heat exchanger 47 is attached to the annular regions, 44 and 46, between the two source ends, 24 and 26, to form a circulation system through which a heat transfer medium is circulated into the first annular region 44 at the source end 24. The heat transfer medium flows through the first annular region 44 and the fluid channel 48 into the second annular region 46. The heat transfer medium flows through the second annular region 46 and returns to the heat exchanger 47 through the source end 26. An advantage of having all of the dispenses lines in a common heat exchange system is that the temperature in the dispense lines can be commonly controlled, thereby eliminating problems associated with synchronizing separate circulation systems.

In a preferred embodiment, the solvent line 16 passes through the fluid channel 48 so as to minimize disturbances in the flow field, but does not fluidly communicate with the channel 48. The fluid channel 48 has a dimension in the direction perpendicular to the direction of flow that is substantially equal to or less than the cross section of the dispense lines, but is greater than the dimension of the solvent line 16, so that the solvent line 16 does not prevent fluid communication within the fluid channel 48 by blocking the flow path. Alternatively, the solvent line 16 does not have to pass through fluid channel 48; however, this would tend to make the flow field somewhat less uniform around the apparatus 10, which is considered undesirable.

Also in a preferred embodiment, the dispense ends 20 and 22, include nozzle assemblies, 60 and 62, respectively, that are removably attached such as by threading. In a preferred embodiment, the nozzle assemblies, 60 and 62 includes a tubular fitting 64 having first and second ends, 66 and 68, respectively. The first end 66 are inserted into and provide fluid communication with the dispense ends 41 of the dispense lines 40 and 42, respectively, and are secured by collars 70 around the outside of the dispense lines 40 and 42, respectively. The fitting 64 has an outer surface 72 containing two circumferential recesses that are sized to receive two O-ring gaskets 74 used to seal the interior regions 28 and 30. The nozzles 76 are connected to the second end 68 of the fitting 64 to provide fluid communication with the dispense tubes, 40 and 42, respectively, and secured by nozzle housings 78 to the dispense lines, 12 and 14.

Preferably, the solvent bath 18 provides for storage and cleaning of the nozzle assemblies, 60 and 62, respectively between coating evolutions. The bath 18 includes a purge section 80, a bath section 82 and a vapor return section 84. The purge section 80 includes a bottom portion 86 and a top 88 containing three ports 90 that are sized to receive the first and second dispense lines, 12 and 14, respectively, and the solvent line 16. The purge section 80 further includes a cleaning member 92 containing two holes 94. As such, the cleaning member 92 is disposed within the purge section 80 proximate to the top 88 and the holes 94 are aligned with the ports 90 in the top 88 so that the first and second dispense ends, 20 and 22, respectively, extend through the ports 90 and the holes 94. The cleaning member 92 has a top surface 96 that is preferably sloped toward the holes 94 to direct the flow of solvent introduced into the purge section 80 through the solvent dispense tube 38 to rinse excess coating material off the nozzle assemblies, 60 and 62, respectively. The bottom 86 of the purge section 80 contains an exhausted drain 98 to remove the excess solvent and coating material from the purge section 80.

The bath section 82 includes a top 100 containing three ports 102 that are sized to receive the first and second dispense lines, 12 and 14, respectively, and the solvent line 16, a liquid region 104 and vapor region 106. The bath section 82 is connected to the purge section 80 by an opening 108, which defines the maximum height of the liquid region 104. The solvent line 16 is used to maintain liquid solvent in the bath section 82. The vapor return section 84 is connected to the vapor region 106 of the bath section 82 and to the exhausted drain 98.

In the operation of the present invention, the apparatus 10 is initially in a stored position with the first and second dispense ends, 20 and 22, respectively, and the solvent dispense end 32 disposed in the bath section ports 102. The solvent dispense tube 38 is connected to a solvent source and the bath section 82 is filled to opening 108 with liquid solvent using dispense tube 38. The solvent evaporating from the liquid region 104 contacts the nozzles 76, thereby preventing the coating material contained in the nozzles from drying out and the excess vapor is drawn through the vapor return section 84 to the exhausted drain 98. The heat transfer medium is introduced into the source end 24 of the first dispense line 12, flows through the annular region 44 into fluid channel 48 and exits the apparatus 10 through the annular region 46 and source end 26 of the second dispense line 14. The apparatus 10 is then raised by mechanism 110 to lift the dispense ends 20 and 22, respectively, and solvent dispense end 32 out of the port 102 in the bath section 82, as shown in FIG. 1. The apparatus 10 is then moved into position over a coating bowl 112 containing the rotating surface 15 of the wafer supported by a rotatable chuck 114 attached by a shaft 116 to a spin motor 118. The coating liquid is introduced from the liquid sources into source ends 43 of the dispense tubes, 40 and 42, respectively, and the coating liquid moves through the dispense tubes, 40 and 42, respectively, and the nozzles 76 onto the rotating surface 15. After the coating liquid has been dispensed, the apparatus 10 is moved away from the rotating surface 15 and the dispense ends 20 and 22, respectively, and the solvent dispense end 37 are placed through ports 90 in the purge section 80, the nozzles 76 passing through the holes 94. Solvent is introduced from the solvent source through solvent dispense tube 38 toward the top surface 96 which directs the solvent toward the dispense ends, 20 and 22, so as to rinse the liquid residue off the nozzle assemblies, 60 and 62, respectively. The first and second dispense tube, 40 and 42, respectively, can then be purged and the purged coating liquid and the used solvent exit the purge section 80 through the exhausted drain 98. The apparatus 10 is then be returned to the stored position in the bath section 82.

While the present invention has been described with respect to a two dispense line apparatus, the utility of the present invention can be extended to include any number of dispense lines. In fact, an increase in the number of dispense lines should coincide with a decrease in the diameter that will serve to further increase the uniformity of the flow field. The capability to provide for a relatively uniform flow field with multiple nozzles is of particular importance if the apparatus is being employed to dispense coating material onto a surface that is sufficiently large that one dispense line will not reliably be able to provide full coverage of the surface. An example of which would be in spin coating a large diameter wafer, where the dispense lines could be employed at regular intervals to more fully ensure full coverage of the wafer surface.

Those of ordinary skill in the art will appreciate that the present invention provides several advantages over the prior art. In particular, the subject invention provides a more uniform flow of air near the wafer surface to provide for a more uniform coating. The subject invention also provides an apparatus for use in dispensing liquids at a number of different positions over larger surfaces where it would be impractical to dispense process liquids over the surface using a single dispense line. While the subject invention provides these and other advantages over prior art, it will be understood, however, that various changes in the details, materials and arrangements of parts which have been herein described and illustrated in order to explain the nature of the invention may be made by those skilled in the art within the principle and scope of the invention as expressed in the appended claims.

What is claimed is:

1. A method of providing a substantially uniform gas flow field near a rotating surface upon which a process liquid is to be dispensed, the method comprising:

providing at least two process liquid dispense lines having substantially uniform cross sectional dimensions and outlets;

aligning the process liquid dispense line outlets for simultaneous operation over the rotating surface in a generally parallel alignment;

connecting the process liquid dispense lines to a common liquid source;

separating the process liquid dispense lines by a distance at least as large as the largest cross sectional dimension of the process liquid dispense lines, so as to minimize the disturbance of the gas flow field near the surface aligning a solvent dispense line parallel to and between the process liquid dispense lines, wherein the solvent dispense line is connected to a second liquid source;

dispensing the process liquid onto the rotating surface from the outlets of the two process liquid dispense lines simultaneously; and dispensing the second liquid from the solvent dispense line.

2. The method of claim 1, wherein said providing further comprises providing at least two dispense lines having cross sectional areas that minimize the total cross sectional area of said dispense lines.

3. A method of providing a uniform coating of a first liquid on a rotating surface, comprising:

aligning a first dispense line having an outlet and a second dispense line having an outlet such that the first dispense line and the second dispense line have substantially uniform cross-sectional dimensions and outlets, the outlets are in a generally parallel alignment, and the dispense lines are separated by a distance at least as large as the largest cross-sectional dimension of the dispense lines, so as to minimize the disturbance of the gas flow field near the rotating surface;

aligning a solvent line parallel to and between the first and second dispense lines, wherein the solvent line is connected to a second liquid source;

rotating the surface;

extracts the first liquid from a single source;

dispensing the first liquid onto the rotating surface from the first dispense line outlet and the second dispense line outlet simultaneously;

distributing the first liquid on the surface by rotating the surface; and dispensing the second liquid from the solvent source.

4. The method of claim 3, wherein:

the solvent line is separated laterally from the first dispense line by a distance at least as large as the diameter of the first dispense line; and the solvent line is separated laterally from the second dispense line by a distance at least as large as the diameter of the second dispense line, so as to minimize the disturbance of the gas flow field near the surface.

5. The method of claim 4, wherein the diameter of the solvent line is less than the diameter of the first dispense line and the diameter of the solvent line is less than the diameter of the second dispense line.

6. A method for dispensing liquid onto a rotating surface, comprising:

connecting a first dispense line having a diameter and a second dispense line having a diameter each to a common liquid source;

separating the first and second dispense lines by a lateral distance equal to at least the larger of the diameter of the first dispense line and the diameter of the second dispense line;

aligning a solvent line parallel to and between the first and second dispense lines and connecting the solvent line to a second liquid source;

positioning said first and second dispense lines for simultaneous operation over the rotating surface;

dispensing liquid from the common liquid source, through the first and second dispense lines simultaneously, onto the rotating surface; and dispensing solvent from the solvent source.

7. The method of claim 6, wherein:

the solvent line is separated laterally from the first dispense line by a distance at least as large as the diameter of the first dispense line; and the solvent line is separated laterally from the second dispense line by a distance at least as large as the diameter of the second dispense line, so as to minimize the disturbance of the gas flow field near the surface.

8. The method of claim 7, wherein the diameter of the solvent line is less than the diameter of the first dispense line and the diameter of the solvent line is less than the diameter of the second dispense line.

9. A method for dispensing liquid onto a rotating surface, comprising:

separating first and second dispense lines by a lateral distance equal to at least the larger of the diameter of the first dispense line and the diameter of the second dispense line;

disposing a first dispense tube within the first dispense line;

disposing a second dispense tube within the second dispense line;

connecting the first dispense tube to a first liquid source;

connecting the second dispense tube to the first liquid source;

disposing a solvent line, having a solvent dispense tube, parallel to and between the first and second dispense lines;

connecting the solvent dispense line to a second liquid source;

dispensing liquid from the liquid source, simultaneously through the first and second dispense tubes, onto the rotating surface; and dispensing solvent from the solvent dispense source, through the solvent dispense tube.

10. The method of claim 9, wherein:

the solvent line is separated laterally from the first dispense line by a distance at least as large as the diameter of the first dispense line; and the solvent line is separated laterally from the second dispense line by a distance at least as large as the diameter of the second dispense line, so as to minimize the disturbance of the gas flow field near the surface.

11. The method of claim 10, wherein the diameter of the solvent line is less than the diameter of the first dispense line and the diameter of the solvent line is less than the diameter of the second dispense line.

* * * * *

UNITED STATES PATENT AND TRADEMARK OFFICE
CERTIFICATE OF CORRECTION

PATENT NO.     : 6,162,507
DATED           : December 19, 2000
INVENTOR(S)   : Hayes, Bruce It is certified that error appears in the above-identified patent and that said Letters Patent is hereby corrected as shown below:

<u>Title page,</u>
Item [57], ABSTRACT,
Line 7, delete "tube" and insert thereof -- tubes --.

<u>Column 2,</u>
Line 11, insert -- of -- after "characteristics".
Line 17, delete "an" after "discloses" and insert therefor -- a --.
Line 37, delete "disperse" and insert therefor -- dispense --.

<u>Column 3,</u>
Line 35, delete "," and insert therefor -- ; and --.
Line 42, delete "or" and insert therefor -- for --.

<u>Column 5,</u>
Line 9, delete "dispenses" and insert therefor -- dispense --

Signed and Sealed this

Eighth Day of October, 2002

Attest:

JAMES E. ROGAN
*Attesting Officer*          *Director of the United States Patent and Trademark Office*